United States Patent [19]
De Wit

[11] Patent Number: 5,629,698
[45] Date of Patent: May 13, 1997

[54] AUTOMATIC OFFSET TRACKING AND CORRECTING CIRCUIT AND METHOD OF OPERATION

[75] Inventor: Michiel De Wit, Dallas, Tex.

[73] Assignee: Texas Instruments Incorporated, Dallas, Tex.

[21] Appl. No.: 651,021

[22] Filed: May 21, 1996

Related U.S. Application Data

[63] Continuation of Ser. No. 177,830, Jan. 5, 1994, abandoned.

[51] Int. Cl.[6] .................................................. H03M 1/06
[52] U.S. Cl. .................................................. 341/118
[58] Field of Search .................................... 341/118, 119, 341/120, 121, 150, 172, 155

[56] References Cited

U.S. PATENT DOCUMENTS 4,799,042  1/1989  Confalonier et al. ................ 341/118
4,803,462  2/1989  Hester et al. ........................ 341/172
4,860,232  8/1989  Lee et al. ......................... 364/571.04

OTHER PUBLICATIONS

"A Guide to Linear Circuit Design, 1990", *Linear Applications Handbook*, published by Linear Technology Corporation, 1990.

*Primary Examiner*—Brian K. Young
*Attorney, Agent, or Firm*—Jacqueline J. Garner; William B. Kempler; Richard L. Donaldson

[57] ABSTRACT

An analog-to-digital conversion system (6) is provided which includes an analog-to-digital converter (8) having a first node (NODE 1) and a second node (NODE 2). An automatic offset tracking and correcting circuit (10) is coupled to the first node (NODE 1) and the second node (NODE 2).

20 Claims, 4 Drawing Sheets

AUTOMATIC OFFSET TRACKING AND CORRECTING CIRCUIT AND METHOD OF OPERATION

This application is a continuation of application Ser. No. 08/177,830, filed Jan. 5, 1994 now abandoned.

TECHNICAL FIELD OF THE INVENTION

This invention relates in general to the field of electronic circuits and more particularly to an improved automatic offset tracking and correcting circuit and method of operation.

BACKGROUND OF THE INVENTION

Charge redistribution analog-to-digital converters are widely used to convert analog signals into binary digital representations. These converters sample an analog voltage signal and convert the analog signal to digital code. Charge redistribution analog-to-digital converters generally consist of a binarily-weighted array of capacitors connected to a comparator. Often, the comparator is comprised of a series of differential-type or inverter-type amplifiers. Charge redistribution analog-to-digital converters utilize successive approximation register (SAR) logic to set three-state switches connected to the bottom plates of the capacitors in the capacitor array. The three states for the three-state switches are a connection to the input voltage, a connection to ground potential, and a connection to a reference voltage. The top plates of the capacitors in the capacitor array are connected together to form one node which is the top plate of the capacitor array.

A problem common to charge redistribution analog-to-digital converters is a voltage offset which affects the output voltage of the comparator. This voltage offset can cause inaccurate conversions of the analog signal to digital code.

SUMMARY OF THE INVENTION

A need has arisen for an electronic circuit which quickly reduces or eliminates the voltage offset from a charge redistribution analog-to-digital converter.

In accordance with the present invention, an improved automatic offset tracking and correcting circuit for a charge redistribution analog-to-digital converter is provided which substantially eliminates or reduces disadvantages and problems associated with prior circuits for reducing or eliminating a voltage offset.

According to one embodiment, an analog-to-digital conversion system is provided which comprises a sampling network and an automatic offset tracking and correcting circuit. The sampling network comprises a plurality of capacitors having a first node of each capacitor coupled to a common node. The automatic offset tracking and correcting circuit is coupled to the common node of the sampling network and operable to sense an offset voltage present on the common node during the operation of the sampling network and to inject charge onto the common node and pull charge from the common node responsive to the sensing of the offset voltage in order to reduce the offset voltage.

According to a further embodiment, a method of tracking and correcting an offset voltage in an analog-to-digital conversion system is provided which comprises the following steps. The first step includes sensing an offset voltage present on a node in an analog-to-digital conversion system. The second step includes setting a charge sign and an amount of charge to provide to the node. The third step includes reducing the offset voltage by injecting the amount of charge onto the node when the charge sign is positive and by pulling the amount of charge from the node when the charge sign is negative. The final step includes repeating the steps of sensing, setting and reducing after each conversion and before a next conversion.

BRIEF DESCRIPTION OF THE DRAWINGS

A more complete understanding of the present invention may be acquired by referring to the following description taken in conjunction with the accompanying drawings in which like reference numbers indicate like features and wherein.

DETAILED DESCRIPTION OF THE INVENTION

An automatic offset tracking and correcting circuit constructed according to the teachings of the present invention provides fast correcting of a voltage offset in an analog-to-digital conversion system without the necessity of sampling a zero voltage input. Thus, a technical advantage of the present invention is the speed with which an offset voltage is reduced or eliminated. The circuit of the present invention adds only a few clock cycles after each conversion during which the voltage offset is sensed and an amount of charge to be used to reduce or eliminate the offset voltage is updated. Accomplishing this reduction of the voltage offset in a few clock cycles greatly speeds the operation of the analog-to-digital conversion system.

Figure 1:
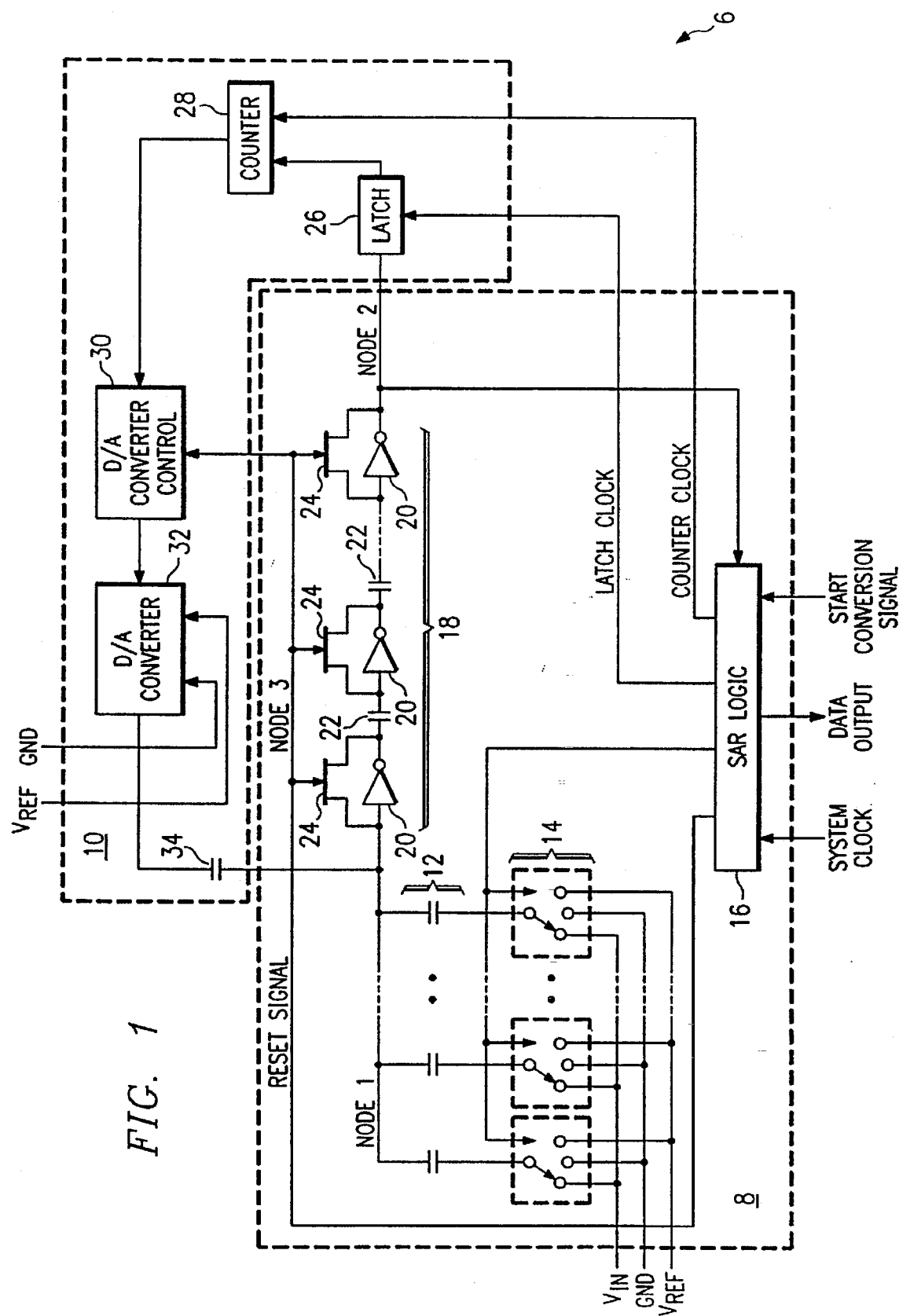
FIG. 1 illustrates a circuit diagram of an analog-to-digital conversion system according to one embodiment of an automatic offset tracking and correcting circuit constructed according to the teachings of the present invention.

FIG. 1 illustrates an analog-to-digital conversion system indicated generally at 6 that uses an automatic offset tracking and correcting circuit constructed according to the teachings of the present invention. The analog-to-digital conversion system 6 includes a charge redistribution analog-to-digital converter 8 and an automatic offset tracking and correcting circuit 10.

The charge redistribution analog-to-digital converter 8 includes a binarily-weighted capacitor array 12. The capacitor array 12 comprises a number of capacitors equal to the number of binary digits used as an output of the charge redistribution analog-to-digital converter 8. Each of the capacitors in the capacitor array 12 comprises a top plate and a bottom plate. The top plates of the capacitors in the capacitor array 12 are connected together at NODE 1. Thus, NODE 1 comprises a top plate for the capacitor array 12. The bottom plate of each capacitor in the capacitor array 12 is connected to a separate three-state switch in a switch array 14.

Each three-state switch in the switch array 14 comprises three inputs to which the three-state switch can connect the bottom plate of the capacitor in the capacitor array 12. One input of each three-state switch in the switch array 14 is connected to an input voltage $V_{IN}$. The second input to each of the three-state switches in the switch array 14 is connected to ground potential GND. The third input of each of the three-state switches in the switch array 14 is connected to a reference voltage $V_{REF}$.

A successive approximation register (SAR) logic 16 provides a control signal to each of the three-state switches in the switch array 14. The SAR logic 16 controls to which input each three-state switch connects the bottom plate of each capacitor in the capacitor array 12. The SAR logic 16 controls the three-state switches in the switch array 14 to accomplish the analog-to-digital conversion. The SAR logic 16 comprises an input connected to NODE 2 which is the comparator output from a series of comparators 18. The SAR logic 16 provides a RESET signal to NODE 3, and a LATCH CLOCK signal and a COUNTER CLOCK signal to the automatic offset tracking and correcting circuit 10. The SAR logic also provides a DATA OUTPUT signal which indicates a digital representation of a sampled input voltage. The SAR logic 16 comprises two further inputs connected to a SYSTEM CLOCK signal and a START CONVERSION signal.

The series of comparators 18 comprises an input connected to NODE 1 and an output connected to NODE 2. The series of comparators 18 includes a number of inverter-type comparators 20 separated by blocking capacitors 22. The series of comparators 18 includes a number of comparators sufficient to amplify the voltage level of NODE 1 to a level sufficient for the comparator output at NODE 2. Each comparator 20 in the series of comparators 18 is bridged by a switch 24. Each of the switches 24 is connected between the input and the output of each comparator 20. Each switch 24 comprises a control input connected to NODE 3. The RESET signal connected to NODE 3 operates to close/open each of the switches 24.

The automatic offset tracking and correcting circuit 10 includes a latch 26. The latch 26 comprises a first input connected to NODE 2 and a second input connected to the LATCH CLOCK signal. The latch 26 has an output connected to a first input of a counter 28. The counter 28 has a second input connected to the COUNTER CLOCK signal. The counter 28 has an output connected to a first input of a digital-to-analog converter control 30. The digital-to-analog converter control 30 has a second input connected to NODE 3 and therefore to the RESET signal. The digital-to-analog converter control 30 has an output connected to a first input of a digital-to-analog converter 32. In one embodiment of the present invention the digital-to-analog converter 32 comprises a charge redistribution digital-to-analog converter. The digital-to-analog converter 32 has a second input connected to ground potential GND and a third input connected to the reference voltage $V_{REF}$. The digital-to-analog converter 32 has an output connected to a first node of an attenuating capacitor 34. The attenuating capacitor 34 has a second node coupled to NODE 1. Thus, the automatic offset tracking and correcting circuit 10 connects to the charge redistribution analog-to-digital converter 8 at NODE 1 and NODE 2 and is connected to the RESET signal connected to NODE 3.

In operation, the analog-to-digital conversion system of FIG. 1 converts an analog input voltage $V_{IN}$ to a digital code with a number of binary bits equal to the number of capacitors in the capacitor array 12. The charge redistribution analog-to-digital converter 8 operates in the manner of conventional charge redistribution analog-to-digital converters. The SAR logic 16 initiates conversion responsive to the START CONVERSION signal. The SYSTEM CLOCK signal comprises a synchronous square wave and provides a clocking signal for the SAR logic 16. The charge redistribution analog-to-digital converter 8 operates by sampling the input voltage $V_{IN}$ with the RESET signal in an "on" state. The SAR logic 16 then sets the RESET signal in an "off" state and the bottom plates of the capacitors in the capacitor array 12 to ground using the three-state switches in the switch array 14. The SAR logic 16 then controls the three-state switches in the switch array 14 to create the digital code which represents the sampled input voltage. The SAR logic 16 operates to set the three-state switches in the switch array 14 to either $V_{IN}$, GND or $V_{REF}$ as appropriate for sampling the analog input voltage $V_{IN}$ and converting $V_{IN}$ to a digital code. The SAR logic 16 sequentially determines how to set each of the three-state switches in the switch array 14 based upon the comparator output at NODE 2. The states of each of the switches after the sequential comparison is concluded indicates the digital representation of the input voltage level $V_{IN}$. The SAR logic 16 provides the digital code as the DATA OUTPUT signal. The series of comparators 18 operates to amplify the voltage level of NODE 1 and produce a comparator output at NODE 2. This comparator output is used as an input by the SAR logic 16 as described above.

The automatic offset tracking and correcting circuit 10 operates to track a voltage offset in the charge redistribution analog-to-digital converter 8 and to reduce the voltage offset by injecting charge into or pulling charge from NODE 1. After the charge redistribution analog-to-digital converter 8 has converted the analog input voltage to a digital code, the RESET signal closes all of the switches 24 which bridge the comparators 20 in the series of comparators 18. With the input connected to the output, each comparator 20 is induced to set the voltage at the input and the output equal to the trip point of the comparator 20. This process of setting each comparator 20 takes less than one clock cycle because NODE 1 is left close to the trip point by the previous conversion. After the RESET signal has closed the switches for one clock cycle, the RESET signal opens the switches 22 which bridge the comparators 20 of the series of comparators 18. When the switches 24 are opened, any voltage offset in the charge redistribution analog-to-digital converter 8 is detectable at NODE 2.

The automatic offset tracking and correcting circuit 10 operates to sense and reduce the voltage offset. The latch 26 operates to sense the voltage offset at NODE 2 and store the voltage offset as a digital one or zero depending upon whether the voltage offset is positive or negative. The LATCH CLOCK signal signals the latch 26 to store the voltage offset at NODE 2 as a digital value after the RESET signal has opened the switches 24 to induce the offset at NODE 2. Thus, the latch 26 holds a one or a zero which indicates whether the voltage offset is positive or negative, respectively.

The counter 28 operates to count up or down depending upon the input provided by the latch 26. If the latch 26 has stored a one and provides a one to the counter 28, then the counter 28 will count up one when the COUNTER CLOCK signal clocks the counter 28. On the other hand, if the latch 26 has stored a zero and provides a zero to the counter 28 as an input, then the counter 28 will count down one when the COUNTER CLOCK signal clocks the counter 28. The COUNTER CLOCK signal clocks the counter 28 only once for each conversion.

Thus, after each conversion by the charge redistribution analog-to-digital converter 8, the voltage offset is induced at NODE 2, the LATCH CLOCK signal clocks the latch 26 once, and the COUNTER CLOCK signal clocks the counter 28 once. The result is that the counter 28 counts either up one or down one depending upon whether the voltage offset is positive or negative, respectively. The counter 28 provides the current count to the digital-to-analog converter control 30. The count in the counter 28 represents the number of times the voltage offset was sensed by the latch 26 to be positive subtracted by the number of times the voltage offset was sensed to be negative. The counter 28 is configured such that a carry or borrow causes the counter 28 to hold the current count. For example, if the counter 28 has a current count of all ones and increments, the carry causes the current count to remain at all ones.

The digital-to-analog converter control 30 utilizes the count output by the counter 28 to control the digital-to-analog converter 32. The RESET signal also operates to reset the digital-to-analog converter control 30 so that its output is $V_{REF}/2$ when the RESET signal closes the switches 24 and then opens the switches 24 to induce the voltage offset at NODE 2. The digital-to-analog converter control 30 uses the current count output by the counter 28 to set the voltage output from the digital-to-analog converter 32. The digital-to-analog converter control 30 uses the most significant bit of the count of the counter 28 as a sign bit. This sign bit informs the digital-to-analog converter control 30 whether the output of the digital-to-analog converter 32 should be positive or negative relative to $V_{REF}/2$. The digital-to-analog converter control 30 uses one or more of the following bits of the output of the counter 28 to set the magnitude of the voltage output from the digital-to-analog converter 32.

In this way, the digital-to-analog converter control 30 operates to set the digital-to-analog converter 32 to output a number of levels of charge equal to the possible numbers represented by the bits used by the digital-to-analog converter control 30. For example, if the counter 28 were to provide the digital-to-analog converter control 30 with a three-bit count, then there are eight levels of charge comprising four possible magnitudes with a sign bit indicating either positive or negative charge.

The digital-to-analog converter 32 operates either to provide a charge to the attenuating capacitor 34 or pull charge from the attenuating capacitor 34. The amount of charge injected or pulled by the digital-to-analog converter 32 is set by the digital-to-analog converter control 30 as described above.

The attenuating capacitor 34 is smaller than the total capacitance of the capacitor array 12. The attenuating capacitor 34 and the capacitor array 12 form a capacitor voltage divider dividing the voltage output by the digital-to-analog converter 32. The level of voltage which appears at NODE 1 is equal to the ratio of the attenuating capacitor to the total of the attenuating capacitor plus the capacitor array 12 multiplied by the output voltage of the digital-to-analog converter 32. The attenuating capacitor 34 is small enough to make each element of charge contributed by the digital-to-analog converter 32 equal to a voltage level less than a voltage level associated with the least significant bit of the charge redistribution analog-to-digital converter 8. In one embodiment of the present invention, the attenuating capacitor 34 is set to a value making the minimum element of charge output by the digital-to-analog converter 32 equal to one-sixteenth of a least significant bit of the charge redistribution analog-to-digital converter 8.

The charge redistribution analog-to-digital converter 8 operates as a sampling network to sample an input voltage and to convert the sampled input voltage to a digital representation. The automatic offset tracking and correcting circuit 10 operates as a unit to settle on a charge value output by the digital-to-analog converter 32 which will reduce the voltage offset in the charge redistribution analog-to-digital converter 8 to less than the voltage associated with the least significant bit of the capacitor array 12. Once the automatic offset tracking and correcting circuit 10 has settled at an equilibrium, the counter 28 counts up one and down one with each conversion. Thus, the reduced voltage offset will oscillate between slightly above and slightly below ground potential. In this manner, the automatic offset tracking and correcting circuit operates to reduce or eliminate the voltage offset in a minimum of clock cycles.

The design of the automatic offset tracking and correcting circuit 10 requires deciding upon a value for the maximum magnitude of charge that can be injected or pulled by the digital-to-analog converter 32 and upon the minimum final variance in the voltage offset. The maximum magnitude of charge is set by the number of bits used by the digital-to-analog converter control 30 to control the digital-to-analog converter 32. The minimum final variance is set by the ratio of the attenuating capacitor 34 to the total capacitance of the capacitor array 12 as described above.

Figure 2:
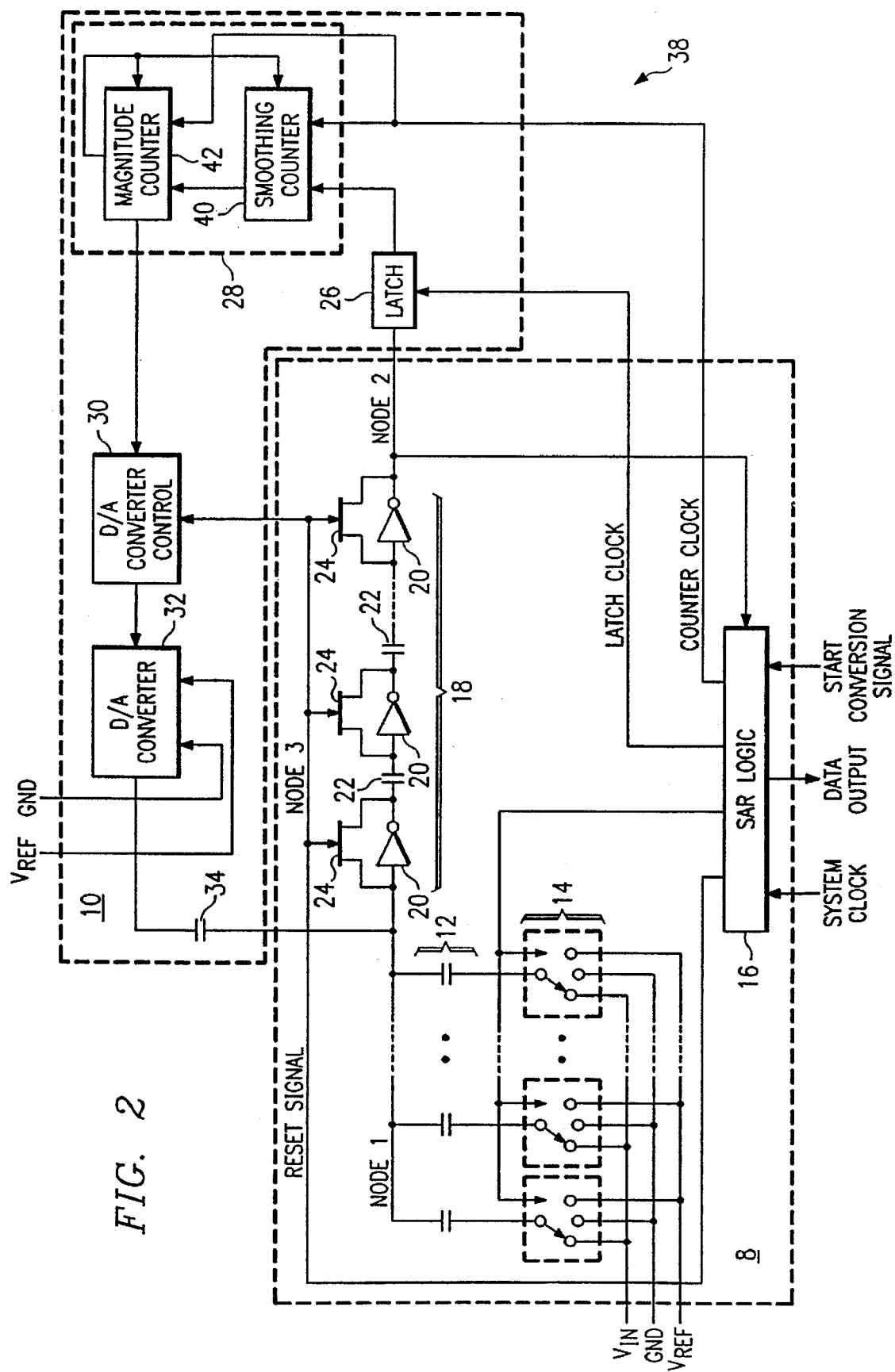
FIG. 2 illustrates a circuit diagram of an analog-to-digital conversion system according to a second embodiment of an automatic offset tracking and correcting circuit constructed according to the teachings of the present invention.

FIG. 2 illustrates an analog-to-digital conversion system 38 including another embodiment of an automatic offset tracking and correcting circuit constructed according to the teachings of the present invention. The analog-to-digital conversion system 38 of FIG. 2 has a similar configuration as the analog-to-digital conversion system 6 of FIG. 1 with like numbers representing like elements. The one difference between system 38 and system 6 is that system 38 shown in FIG. 2 includes a counter 28 which comprises a smoothing counter 40 and a magnitude counter 42.

The output of the latch 26 is connected to a first input of the smoothing counter 40. A second input of the smoothing counter 40 is connected to the COUNTER CLOCK signal. A third input of the smoothing counter 40 is connected to a first output of the magnitude counter 42. The magnitude counter 42 comprises a first input connected to an output of the smoothing counter 40 and comprises a second input coupled to the first output of the magnitude counter 42. A second output of the magnitude counter is connected to the first input of the digital-to-analog converter control 30. The structure and operation of analog-to-digital conversion system 38 of FIG. 2 is otherwise the same as that illustrated in FIG. 1 with reference to system 6.

In operation, the analog-to-digital conversion system 38 of FIG. 2 operates as described with respect to system 6 of FIG. 1 except for the operation of the counter 28. The counter 28 operates to provide a count to the digital-to-analog converter control 30 as described with respect to FIG. 1. However, the counter 28 of FIG. 2 comprises a smoothing counter 40 and a magnitude counter 42.

The smoothing counter 40 operates to count up or down according to the output of the latch 26. When the smoothing counter 40 is clocked by the COUNTER CLOCK signal, the smoothing counter 40 counts up one if the output of the latch 26 is a one and counts down one if the output of the latch 26 is a zero. The smoothing counter 40 provides a carry bit and a borrow bit to the magnitude counter 42.

The magnitude counter 42 operates to count up or down responsive to the carry and borrow bits provided by the smoothing counter 40. When clocked by the COUNTER CLOCK signal, the magnitude counter 42 uses the carry bit from the smoothing counter 42 to increment its count and uses the borrow bit from the smoothing counter 40 to decrement its count. Thus, the magnitude counter 42 changes in value only when the smoothing counter 42 reaches its highest number and moves higher or reaches its lowest number and moves lower. The smoothing counter 40 operates to filter the output of the latch 26 such that the magnitude counter 42 increments or decrements only after the output of the latch 26 has repeated often enough for the smoothing counter 40 to provide a carry or borrow bit.

The magnitude counter 42 provides a carry bit and borrow bit to the magnitude counter 42 and the smoothing counter 40. The carry and borrow bits from the magnitude counter 42 are tied to the magnitude counter 42 and the smoothing counter 40 to hold the counts at all ones and at all zeroes. Thus, neither the magnitude counter 42 nor the smoothing counter 40 counts down when both are all zeroes or counts up when both are all ones, but instead the counts remain at all zeroes or all ones.

The magnitude counter 42 provides a count to the digital-to-analog converter control 30 which uses the count as described with reference to FIG. 1. The count from the magnitude counter 42 comprises a most significant bit and a plurality of less significant bits. The plurality of less significant bits is equal in number to the number of bits in the digital-to-analog converter 32. In one embodiment of the present invention, the digital-to-analog converter 32 comprises a capacitor for each bit, with each capacitor having a bottom plate which can be connected to ground potential or the reference voltage $V_{REF}$. One embodiment of the digital-to-analog converter control 30 uses the output of the magnitude counter 42 according to the logic table shown in TABLE 1. The S in TABLE 1 represents the sign bit which is the most significant bit of the count from the magnitude counter 42. The Q represents one of the less significant bits from the magnitude counter 42. The R represents the RESET signal, and $V_O$ represents the setting of the bottom plate of the capacitor in the digital-to-analog converter 32 corresponding to the bit Q of the magnitude counter 42.

TABLE 1

| R | S | Q | $V_O$ |
|---|---|---|---|
| 1 | 1 | 1 | $V_{REF}$ |
| 1 | 1 | 0 | $V_{REF}$ |
| 1 | 0 | 1 | GND |
| 1 | 0 | 0 | GND |
| 0 | 1 | 1 | GND |
| 0 | 1 | 0 | $V_{REF}$ |
| 0 | 0 | 1 | GND |
| 0 | 0 | 0 | $V_{REF}$ |

Referring to TABLE 1, when Q is equal to one and S is equal to one, $V_O$ is switched from $V_{REF}$ when R is one to GND when R is zero. R is one during reset and zero during sample and convert. When Q is zero, $V_O$ remains at $V_{REF}$ and does not contribute a charge. When Q is zero and S is zero, $V_O$ switches from GND to $V_{REF}$. If $V_O$ is set to GND, the capacitor provides charge. If $V_O$ is set to $V_{REF}$, the capacitor does not provide charge. When the bottom plate of a capacitor is switched from GND to $V_{REF}$, and R switches from one to zero, the digital-to-analog converter output is a positive voltage level. If the bottom plate switches from $V_{REF}$ to GND the output is a negative voltage level. If the bottom plate switches from GND to GND or from $V_{REF}$ to $V_{REF}$, then that particular capacitor does not change the output voltage of the digital-to-analog converter. The analog output of the digital-to-analog converter 32 is the total charge provided by the output voltage of the capacitors in the digital-to-analog converter 32.

Figure 3:
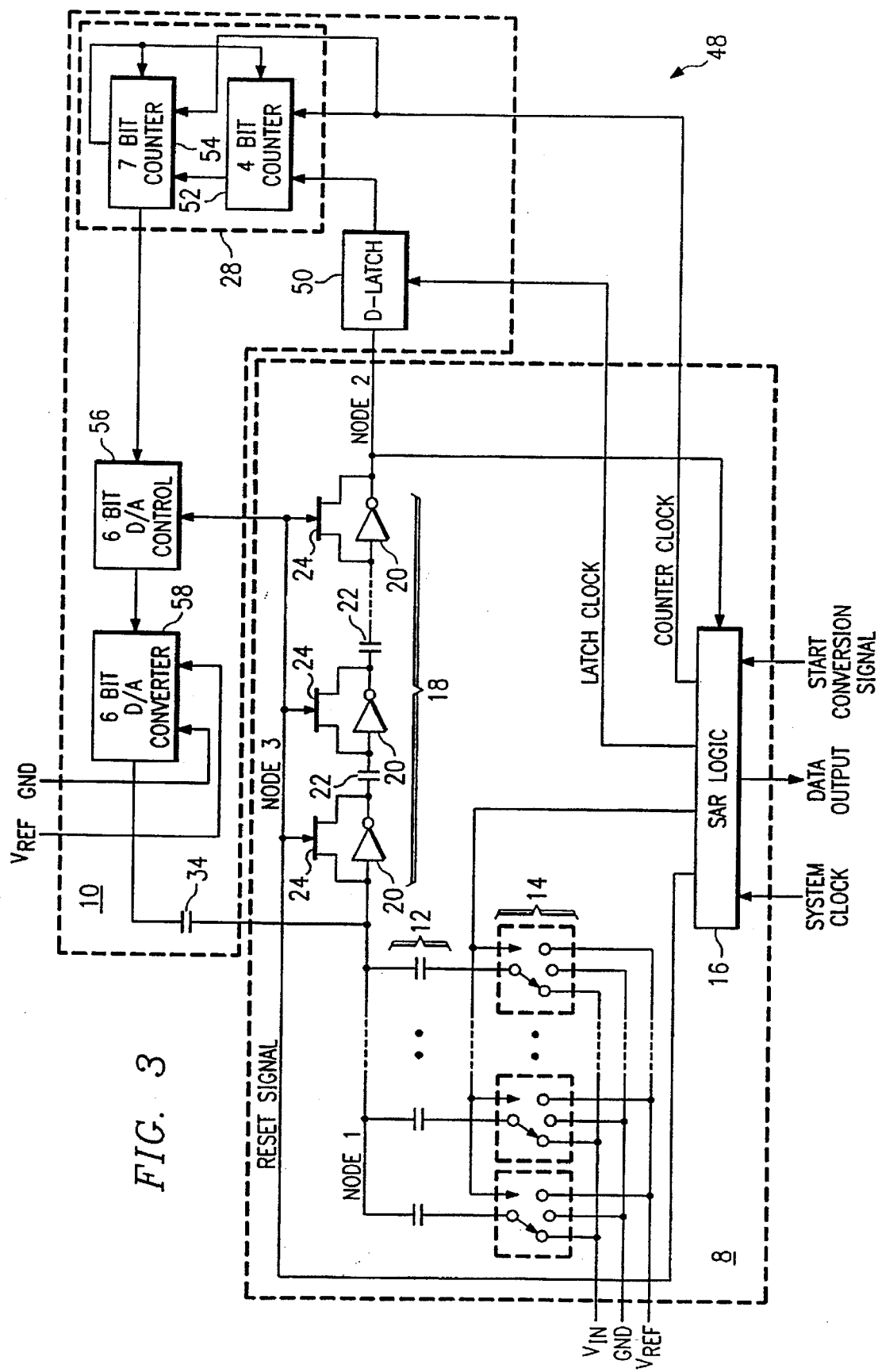
FIG. 3 illustrates a circuit diagram of an analog-to-digital conversion system according to another embodiment of an automatic offset tracking and correcting circuit constructed according to the teachings of the present invention.

FIG. 3 illustrates an analog-to-digital conversion system 48 including another embodiment of an automatic offset tracking and correcting circuit constructed according to the teachings of the present invention. The system 48 illustrated in FIG. 3 has a similar configuration as the system 6 and the system 38 illustrated in FIGS. 1 and 2. The difference is the elements of the automatic offset tracking and correcting circuit 10. A D-latch 50 replaces the latch 26 of FIGS. 1 and 2. A four-bit counter 52 replaces the smoothing counter 40 of FIG. 2 and a seven-bit counter 54 replaces the magnitude counter 42 of FIG. 2. A six-bit digital-to-analog control 56 replaces the digital-to-analog converter control 30 of FIGS. 1 and 2. A six-bit digital-to-analog converter 58 replaces the digital-to-analog converter 32 of FIGS. 1 and 2.

In operation, the automatic offset tracking and correcting circuit 10 of FIG. 3 operates as described with reference to the conversion system 38 of FIG. 2. The D-latch 50 operates to sample the comparator output at NODE 2 and provide an input to the four-bit counter 52. The four-bit counter 52 counts up or down, depending upon the output of the D-latch 50. When the four-bit counter 52 reaches "1111", the four-bit counter 52 provides a carry bit to the seven-bit counter 54 on the next attempted increment. Similarly, the four-bit counter 52 provides a borrow to the seven-bit counter 54 when the four-bit counter 52 reaches "0000" and attempts to decrement. The seven-bit counter 54 counts up or down depending upon the output of the four-bit counter 52. The seven-bit counter 54 provides a carry bit and borrow bit to the seven-bit counter 54 and the four-bit counter 52 to hold the counters so that the counters do not increment above "1111111111" or decrement below "0000000000". The seven-bit counter 54 provides a seven-bit count to the six-bit digital-to-analog control 56.

The six-bit digital-to-analog control 56 uses the output of the seven-bit counter 54 along with the RESET signal to control the six-bit digital-to-analog converter 58. Because the six-bit digital-to-analog converter 58 comprises six bits, the six-bit charge redistributed digital-to-analog converter 58 outputs sixty-four charge levels, thirty-two of which are positive and thirty-two of which are negative. The automatic offset tracking and correcting circuit 10 of FIG. 3 operates to settle on a charge level closest to the voltage offset of the charge redistribution analog-to-digital converter 8. The automatic offset tracking and correcting circuit 10 provides this charge level to NODE 1 to reduce the voltage offset as described above.

Figure 4:
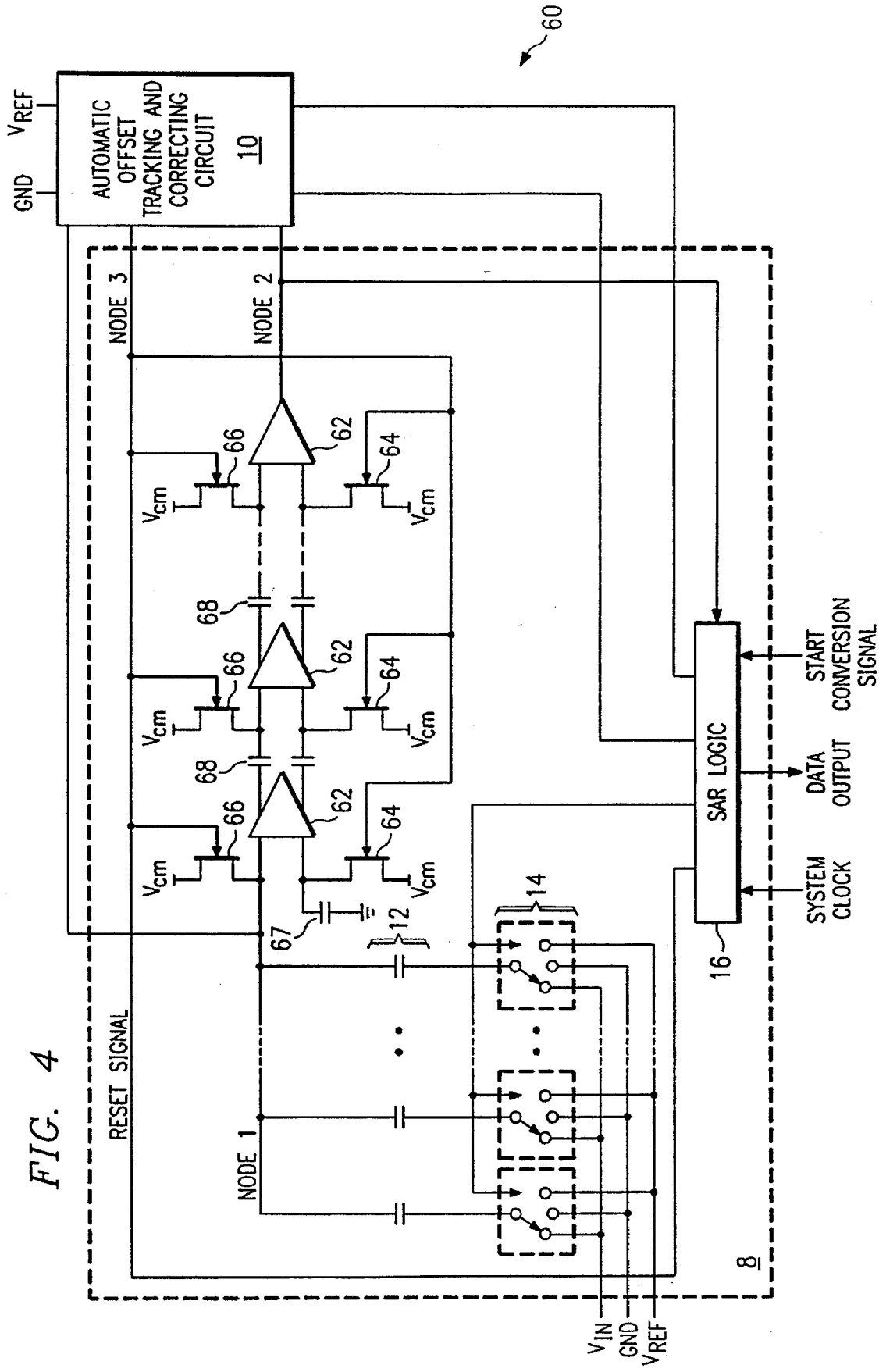
FIG. 4 illustrates a circuit diagram of an analog-to-digital conversion system including differential-type comparators and including an automatic offset tracking and correcting circuit constructed according to the teachings of the present invention.

FIG. 4 illustrates an analog-to-digital conversion system 60 including differential-type comparators and including an automatic offset tracking and correcting circuit of the present invention. The analog-to-digital conversion system 60 of FIG. 4 is similar to the conversion system 6 illustrated in FIG. 1 except for the series of comparators 18. The series of comparators 18 of FIG. 4 comprises a series of differential-type comparators 62. Each differential-type comparator 62 comprises a first input and a second input. The first input of each comparator 62 is connected to a switch 64. Each switch 64 is connected to a positive power supply $V_{CM}$. The control for each switch 64 is connected to NODE 3. The second input of each comparator 62 is connected to a switch 66. Each switch 66 is connected to a positive power supply $V_{CM}$ and to the second input of each comparator 62. The control for each switch 66 is connected to NODE 3. The RESET signal is also coupled to NODE 3. The first input of the first comparator 62 is also connected to a capacitor 67 which is connected to GND, and the second input of the first comparator 62 is also connected to NODE 1. Each comparator 62 comprises a first and a second output connected to a blocking capacitor 68 which is connected to the first or second input of the next comparator 62, respectively. The output of the last comparator 62 is connected to NODE 2.

The series of comparators 18 operate to amplify the voltage level of NODE 1 and provide the amplified voltage level at NODE 2. After the conversion by the charge redistribution analog-to-digital converter 8, the RESET signal closes the switches 66 which forces both inputs of the comparators 62 to $V_{CM}$. The RESET signal then opens the switches 66 which induces a voltage offset at NODE 2. The analog-to-digital conversion system 60 operates otherwise as described with reference to the conversion system 6 of FIG. 1. The automatic offset tracking and correcting circuit operates to sense the voltage offset at NODE 2 and provide charge to or pull charge from NODE 1 in order to reduce the voltage offset.

Although the present invention has been described in detail, it should be understood that various changes, substitutions and alterations can be made hereto without departing from the spirit and scope of the invention as defined by the appended claims.

What is claimed is:

1. An analog-to-digital conversion system, comprising:
    a sampling network comprising a plurality of capacitors having a first node of each capacitor coupled to a common node; and
    an automatic offset tracking and correcting circuit coupled to the common node of the sampling network and operable to sense an offset voltage present on the common node during the operation of the sampling network and to inject charge onto the common node and pull charge from the common node responsive to the sensing of the offset voltage in order to reduce the offset voltage, wherein the automatic offset tracking and correcting circuit is operable to sense a sign of the offset voltage and to inject and pull charge responsive to the sign of the offset voltage.

2. The analog-to-digital conversion system of claim 1, wherein the automatic offset tracking and correcting circuit is operable to sense a sign of the offset voltage and to inject and pull charge responsive to the sign of the offset voltage.

3. The analog-to-digital conversion system of claim 1, wherein the sampling network comprises an analog-to-digital convertor.

4. The analog-to-digital conversion system of claim 1, wherein the sampling network comprises a charge redistribution analog-to-digital convertor.

5. The analog-to-digital conversion system of claim 1, wherein the automatic offset tracking and correcting circuit comprises:
    a sensing device operable to sense a sign of the offset voltage;
    a charge control device coupled to the sensing device and operable to set a charge sign and an amount of charge to provide to the common node, the charge control device responsive to the sign of the offset voltage; and
    a charge generator coupled to the charge control device operable to inject the amount of charge onto the common node when the charge sign is positive and to pull the amount of charge from the common node when the charge sign is negative.

6. The analog-to-digital conversion system of claim 1, wherein the automatic offset tracking and correcting circuit comprises:
    a latch coupled to the common node operable to sense when the offset voltage is above ground potential and when the offset voltage is below ground potential;
    a counter coupled to the latch and operable to maintain a count by incrementing when the offset voltage is above ground potential and decrementing when the offset voltage is below ground potential;
    a digital-to-analog converter control coupled to the counter and operable to receive the count maintained by the counter and to provide control signals; and
    a digital-to-analog converter coupled to the digital-to-analog converter control and operable to provide an output voltage level responsive to the control signals provided by the digital-to-analog converter control.

7. The analog-to-digital conversion system of claim 1, wherein the automatic offset tracking and correcting circuit comprises:
    a latch coupled to the common node operable to sense when the offset voltage is above ground potential and when the offset voltage is below ground potential;
    a counter coupled to the latch, the counter comprising;
        a smoothing counter coupled to the latch operable to maintain a count by incrementing when the offset voltage is above ground potential and decrementing when the offset voltage is below ground potential and operable to provide a carry and a borrow; and
        a magnitude counter coupled to the smoothing counter and operable to receive the carry and the borrow from the smoothing counter and to increment and decrement responsive to the carry and the borrow and operable to maintain a count;
    a digital-to-analog converter control coupled to the counter and operable to receive the count maintained by the magnitude counter and to provide control signals; and
    a digital-to-analog converter coupled to the digital-to-analog converter control and operable to provide an output voltage level responsive to the control signals provided by the digital-to-analog converter control.

8. The analog-to-digital conversion system of claim 1, wherein the analog-to-digital conversion system comprises an integrated circuit.

9. An analog-to-digital conversion system, comprising:
    an analog-to-digital converter comprising a comparator output node, a capacitor top plate node and an offset voltage;
    a latch coupled to the comparator output node and operable to sense when the offset voltage is above ground potential and when the offset voltage is below ground potential;
    a counter coupled to the latch and operable to maintain a count by incrementing when the offset voltage is above ground potential and decrementing when the offset voltage is below ground potential;
    a digital-to-analog converter control coupled to the counter and operable to receive the count maintained by the counter and to provide control signals; and
    a digital-to-analog converter coupled to the digital-to-analog converter control and operable to provide an output voltage level responsive to the control signals provided by the digital-to-analog converter control.

10. The analog-to-digital conversion system of claim 7, further comprising:
    an attenuating capacitor coupled to the digital-to-analog converter and operable to attenuate the output voltage level provided by the digital-to-analog converter and operable to inject charge onto the common node and pull charge from the common node according to the output voltage.

11. The analog-to-digital conversion system of claim 7, wherein the analog-to-digital converter comprises a charge redistribution analog-to-digital converter.

12. The analog-to-digital conversion system of claim 7, wherein the latch comprises a D-latch.

13. The analog-to-digital conversion system of claim 7, wherein the digital-to-analog converter comprises a charge redistribution digital-to-analog converter.

14. The analog-to-digital conversion system of claim 7, wherein the analog-to-digital conversion system comprises an integrated circuit.

15. The analog-to-digital conversion system of claim 7, wherein the counter comprises:

a smoothing counter coupled to the latch operable to maintain a count by incrementing when the offset voltage is above ground potential and decrementing when the offset voltage is below ground potential and operable to provide a carry and a borrow; and a magnitude counter coupled to the smoothing counter and operable to receive the carry and the borrow from the smoothing counter and to increment and decrement responsive to the carry and the borrow and operable to maintain a count.

16. A method of tracking and correcting an offset voltage in an analog-to-digital conversion system, comprising the steps of:

sensing an offset voltage present on a node in an analog-to-digital conversion system;

setting a charge sign and an amount of charge to provide to the node;

reducing the offset voltage by injecting the amount of charge onto the node when the charge sign is positive and by pulling the amount of charge from the node when the charge sign is negative; and repeating the steps of sensing, setting and reducing after each conversion and before a next conversion.

17. The method of claim 16, wherein the step of sensing an offset voltage further comprises sensing a sign of the offset voltage, and wherein the step of setting is responsive to the sign of the offset voltage.

18. The method of claim 16, wherein the step of sensing an offset voltage further comprises sensing a sign of the offset voltage, and the step of setting further comprises updating a count in a counter by incrementing the count when the sign of the offset voltage is positive and decrementing the count when the sign of the count is negative, wherein a most significant bit of the count represents the charge sign and a plurality of remaining bits of the count represents the amount of charge.

19. The method of claim 16, further comprising the step of:

providing a sampling network comprising a plurality of capacitors; and connecting a first node of each capacitor to a common node, wherein the step of sensing an offset voltage comprises sensing an offset voltage on the common node.

20. The method of claim 16, wherein the steps of sensing, setting and reducing are accomplished in two clock cycles.

* * * * *